(12) United States Patent
Il'ichev et al.

(10) Patent No.: US 7,002,174 B2
(45) Date of Patent: Feb. 21, 2006

(54) CHARACTERIZATION AND MEASUREMENT OF SUPERCONDUCTING STRUCTURES

(75) Inventors: Evgeni Il'ichev, Grossschwabhausen (DE); Miroslav Grajcar, Bratislava (SK); Alexandre M. Zagoskin, Vancouver (CA); Miles F. H. Steininger, Vancouver (CA)

(73) Assignee: D-Wave Systems, Inc., Burnaby (CA)

( * ) Notice: Subject to any disclaimer, the term of this patent is extended or adjusted under 35 U.S.C. 154(b) by 283 days.

(21) Appl. No.: 10/321,065

(22) Filed: Dec. 16, 2002

(65) Prior Publication Data

US 2003/0224944 A1 Dec. 4, 2003

Related U.S. Application Data

(60) Provisional application No. 60/341,974, filed on Dec. 18, 2001.

(51) Int. Cl.
*H01L 29/06* (2006.01)

(52) U.S. Cl. .............................. 257/14; 257/9; 257/31; 257/32; 257/35

(58) Field of Classification Search .................. 257/14, 257/9, 31–36
See application file for complete search history.

(56) References Cited

U.S. PATENT DOCUMENTS

| | | | |
|---|---|---|---|
| 3,573,759 | A | 4/1971 | Silver et al. |
| 5,768,297 | A | 6/1998 | Shor |
| 6,459,097 | B1 | 10/2002 | Zagoskin |
| 2002/0117656 | A1 | 8/2002 | Amin et al. |
| 2002/0188578 | A1 | 12/2002 | Amin et al. |
| 2003/0071258 | A1 | 4/2003 | Zagoskin et al. |
| 2003/0193097 | A1 | 10/2003 | Il'ichev et al. |

OTHER PUBLICATIONS

Rifkin et al. (IDS ref. BB).*
Makhlin et al. (IDS ref. AX).*
Mooij et al. (IDS ref. AY).*
Zorin (IDS ref. BI).*
U.S. Appl. No. 60/429,170, Amin et al.
Bocko, M.F., A.M. Herr, and M.J. Feldman, 1997, "Prospects for Quantum Coherent Computation Using Superconducting Effects," IEEE Trans. Appl. Supercond. 7, pp. 3638-3641.
Castellano, M.G., F. Chiarello, C. Cosmelli, P. Carelli, and G. Torrioli, "A Squid Switch for a Macroscopic Quantum Coherence Experiment," Inst. Phys. Conf. Ser. No. 167, pp. 593-596 (2000).
DiVincenzo, D.P., 2000, "The Physical Implementation of Quantum Computation," ArXiv.org preprint server: quant-ph/0002077.

(Continued)

*Primary Examiner*—Nathan J. Flynn
*Assistant Examiner*—Scott R. Wilson
(74) *Attorney, Agent, or Firm*—Jones Day; Brett Lovejoy

(57) ABSTRACT

A structure comprising a tank circuit inductively coupled to a flux qubit or a phase qubit. In some embodiments, a low temperature preamplifier is in electrical communication with the tank circuit. The tank circuit comprises an effective capacitance and an effective inductance that are in parallel or in series. In some embodiments, the effective inductance comprises a multiple winding coil of wire. A method that includes the steps of (i) providing a tank circuit and a phase qubit that are inductively coupled, (ii) reading out a state of the phase qubit, (iii) applying a flux to the phase qubit that approaches a net zero flux, (iv) increasing a level of flux applied to the phase qubit, and (v) observing a response of the tank circuit in a readout device.

3 Claims, 6 Drawing Sheets

OTHER PUBLICATIONS

Friedman, J.R., and D.V. Averin, 2002, "Aharonov-Casher-Effect Suppression of Macroscopic Tunneling of Magnetic Flux," Phys. Rev. Lett. 88, 050403.

Friedman, J.R., V. Patel, W. Chen, S.K. Tolpygo and J.E. Lukens, 2000, "Quantum superposition of distinct macroscopic states," Nature 406, pp. 43-46.

Greenberg, Ya.S., A. Izmalkov, M. Grajcar, E. Il'ichev, W. Krech, H.-G. Meyer, M.H.S. Amin, Alec Maassen van den Brink, 2002, "Low-frequency characterization of quantum tunneling in Flux qubits," ArXiv.org preprint server: cond-mat/0208076.

Han, S., Y. Yu, X. Chu, S.-I. Chu, and Z. Wang, 2001, "Time-Resolved Measurement of Dissipation-Induced Decoherence in a Josephson Junction," Science 293, pp. 1457-1459.

Il'ichev, E., 2001, "Radio-frequency method for characterization of superconducting weak links," Physica C 350, pp. 244-248.

Il'ichev, E., M. Grajcar, R. Hlubina, R.P.J. IJsselsteijn, H.E. Hoenig, H.-G. Meyer, A. Golubov, M.H.S. Amin, A.M. Zagoskin, A.N. Omelyanchouk, and M. Yu. Kupriyanov, 2001, "Degenerate Ground State in a Mesoscopic $YBa_2Cu_3O_{7-x}$ Grain Boundary Josephson Junction," Phys. Rev. Lett. 86, pp. 5369-5372.

Il'ichev, E., V. Zakosarenko, L. Fritzsch, R. Stolz, H.E. Hoenig, H.-G. Meyer, M. Gotz, A.B. Zorin, V.V. Khanin, A.B. Pavolotsky, and J. Niemeyer, 2001, "Radio-frequency based monitoring of small supercurrents," Rev. Sci. Instrum. 72, pp. 1882-1887.

Il'ichev, E., V. Zakosarenko, R.P.J. IJsselsteijn, V. Schultze, H.-G. Meyer, H.E. Hoenig, H. Hilgenkamp, and J. Mannhart, 1998, "Nonsinusoidal Current-Phase Relationship of Grain Boundary Josephson Junctions in High-Tc Superconductors," Phys. Rev. Lett. 81, pp. 894-897.

Il'ichev, E., V. Zakosarenko, V. Schultze, H.-G. Meyer, H.E Hoenig, V.N. Glyantsev, and A. Golubov, 1998, "Temperature dependence of the current-phase relation for $YBa_2Cu_3O_{7-x}$ step-edge Josephson junctions," App. Phys. Lett. 72, pp. 731-733.

Il'ichev, E., T. Wagner, L. Fritzsch, J. Kunert, V. Schultze, T. May, H.E. Hoenig, H. G. Meyer, M. Grajcar, D. Born, W. Krech, M. V. Fistul and A. M. Zagoskin, 2002, "Characterization of superconducting structures designed for qubit realizations," Appl. Phys. Lett. 80, pp. 4184-4186.

Ketchen, M.B., 1987, "Integrated Thin Film dc-SQUID sensors," IEEE Transactions on Magnetics 23, pp. 1650-1657.

Krech, W., D. Born, T. Wagner, and H.-G. Meyer, 2001, "Linear Microwave Response of a Charge-Type Qubit," IEEE Trans. Appl. Supercond. 11, pp. 1022-1025.

Makhlin, Y., G. Schön, and A. Shnirman, 2001, "Quantum-State Engineering with Josephson-Junction Devices," Rev. Mod. Phys. 73, pp. 357-400.

Mooij, J. E., T. P. Orlando, L. Levitov, L. Tian, C. H. van der Wal, and S. Lloyd, 1999, "Josephson Persistent-Current Qubit," Science 285, pp. 1036-1039.

Nakamura, Y., Y.A. Pashkin, and J.S. Tsai, 1999, "Coherent control of macroscopic quantum states in a single-Cooper-pair box," Nature 398, pp. 786-788.

Orlando, T.P., J. E. Mooij, C.H. van der Wal, L.S. Levitov, S. Lloyd, J.J. Mazo, 1999, "Superconducting persistent-current qubit," Phys. Rev. B 60, pp. 15398-15413.

Rifkin, R., D.A. Vincent, B.S. Deaver, Jr., and P.K. Hansma, 1976, "rf SQUID's in the nonhysteretic mode: Detailed comparison of theory and experiment," J. App. Phys 47, pp. 2645-2650.

Silver, A.H., and J.E. Zimmerman, 1967, "Quantum States and Transitions in Weakly Connected Superconducting Rings," Phys. Rev 157, pp. 317-341.

Stolz, R., L. Fritsch, and H.-G. Meyer, 1999, "LTS SQUID sensor with a new configuration," Supercon. Sci. Tech. 12, pp. 806-808.

Van der Wal, C.H., A.C.J. ter Haar, F.K. Wilhelm, R.N. Schouten, C.J.P.M. Harmans, T.P. Orlando, S. Lloyd and J.E. Mooij, 2000, "Quantum Superposition of Macroscopic Persistent-Current States," Science 290, pp. 773-777.

Zhang, Y., M. Gottschlich, H. Soltner, E. Sodtke, J. Schubert, W. Zander, and A.I. Braginski, 1995, "Operation of high-temperature rf SQUID magnetometers using dielectric $SrTiO_3$ resonators," App. Phys. Lett. 67, pp. 3183-3185.

Zhang, Y., N. Wolters, R. Otto and H.-J. Krause, 2002, "Non-constant bias current for dc SQUID operation," Physica C 368, pp. 181-184.

Zorin, A.B., 1996, "Quantum-Limited Electrometer Based on Single Cooper Pair Tunneling," Phys. Rev. Lett. 76, pp. 4408-4411.

Zorin, A.B., 2001, "Radio-Frequency Bloch-Transistor Electrometer," Phys. Rev. Lett. 86, pp. 3388-3391.

* cited by examiner

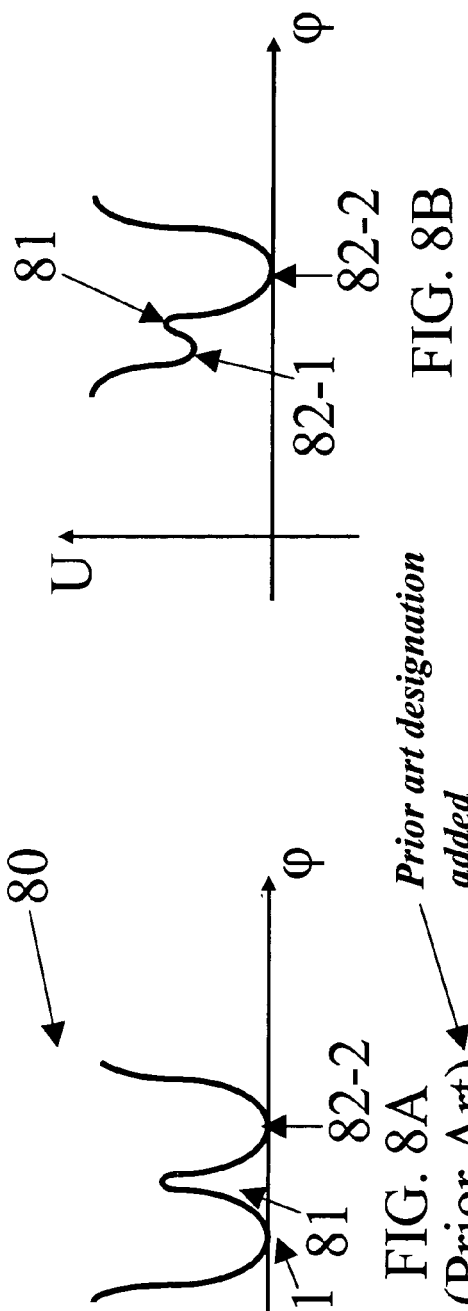
FIG. 8A (Prior Art)
*Prior art designation added*
FIG. 8B
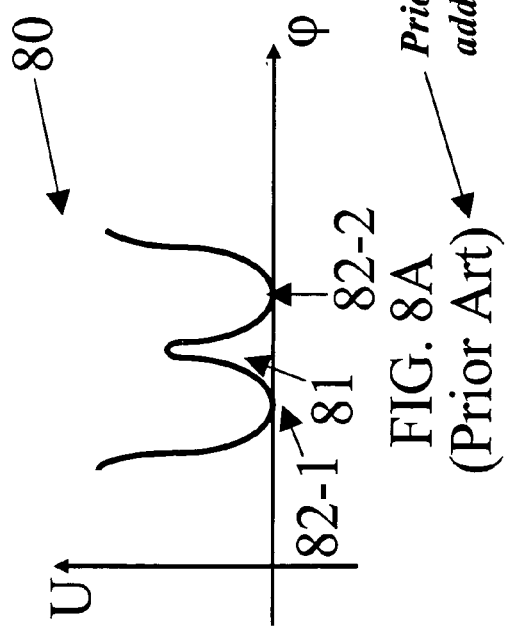
FIG. 8C
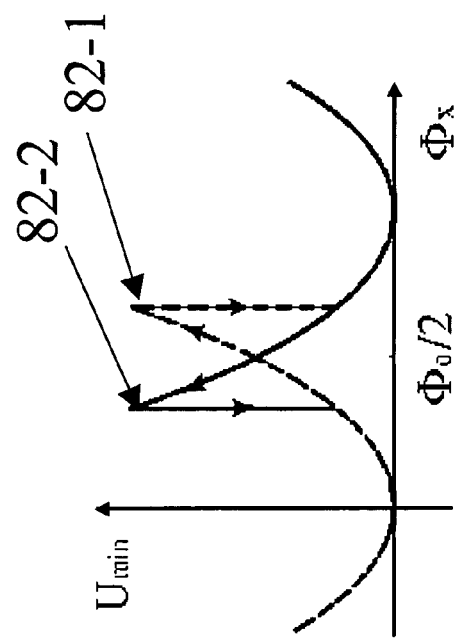
FIG. 8D

CHARACTERIZATION AND MEASUREMENT OF SUPERCONDUCTING STRUCTURES

CROSS-REFERENCE TO RELATED APPLICATIONS

This application claims priority, under 35 U.S.C. § 119(e) of U.S. Provisional Patent Application Ser. No. 60/341,974, filed Dec. 18, 2001, which is hereby incorporated by reference in its entirety.

BACKGROUND

1. Field of the Invention

This invention relates to quantum computing, more specifically to the characterization and measurement of superconducting structures.

2. Description of Related Art

Qubits

A quantum bit or qubit is the building block of a quantum computer. The qubit is similar to a conventional binary bit in that it can be either 0 or 1. However, the analogous states of the qubit are referred to as $|0\rangle$ and $|1\rangle$. These are called the basis states of the qubit. During quantum computation, the state of the qubit becomes a superposition of its basis states. This is very different from the conventional binary bit, and it means that the state of the qubit simultaneously has a nonzero first probability of occupying a first basis state $|0\rangle$ and a nonzero second probability of occupying a second basis state $|1\rangle$. Qualitatively, one can characterize a superposition of basis states as the qubit being in both basis states at once. Mathematically, a superposition is represented in terms of the overall state of the qubit $|\Psi\rangle = \alpha|0\rangle + \beta|1\rangle$, where $\alpha$ and $\beta$ are probability amplitudes having both real and imaginary components. When the state of the qubit is read out, the quantum nature of the qubit is temporarily lost and the superposition collapses to either $|0\rangle$ or $|1\rangle$, thus regaining its similarity to a conventional bit. The state of the qubit after it collapses depends on the probability amplitudes $\alpha$ and $\beta$ just before the readout operation occurs.

The superposition of the basis states of the qubit is one facet of the power harnessed by a quantum computer. In order to be useful, the qubit must be combined with other qubits in a quantum register, where the capacity for representing information grows exponentially with the number of qubits in the quantum register. The power and nature of the quantum computer is well known and described in the art. See, e.g., U.S. Pat. No. 5,768,297 to Shor, which is hereby incorporated by reference in its entirety.

The field of quantum computing remained theoretical until the late 1990s when several hardware proposals were introduced and tested. For a survey of the current physical systems from which qubits can be formed see Braunstein and Lo (eds.), 2001, *Scalable Quantum Computers*, Wiley-VCH Verlag GmbH, Berlin, which is hereby incorporated by reference in its entirety. There are many physical requirements in order to form a quantum computer. See DiVincenzo in Braunstein and Lo (eds.), 2001, *Scalable Quantum Computers.*, but one is that the qubits must be well characterized physical systems. This requirement includes the need to map out the energy potential of qubits and the qubits eigenstates.

Many qubits are superconducting structures. A superconducting material has zero electrical resistance below critical levels of current, magnetic field and temperature. One form of superconducing qubit includes Josephson junctions. There are two classes of qubits that include Josephson junctions charge qubit and phase qubits. Phase and charge are canonically conjugated variables that are related by basic quantum principles. The division of the two classes of qubits that include Josephson junctions is outlined in Makhlin et al., 2001, Reviews of Modem Physics, 73, p. 357, which is hereby incorporated by reference in its entirety.

Double Well Potential

Systems useful for quantum computing can include a double well potential, as depicted in FIG. 8A. A double well potential, 80, shows the energy of a qubit versus the phase of the qubit. There are two metastable states correlated with two minima 82-1 and 82-2. Each minima can include the energy spectrum (i.e. series of quantized energy levels) of a qubit. The basis states $|0\rangle$ and $|1\rangle$ are represented by the ground state energy levels of the system. An example of systems having a double well potential are superconducting Josephson phase qubits in which the basis states of the qubit coincide with the phase of the qubit. In a double well potential, the ground states correlate with the phase states $+\Delta\phi$ and $-\Delta\phi$. Superconducting phase qubits are known in the art and are described in detail in U.S. Pat. No. 6,459,097 B1 to Zagoskin, and U.S. patent application Ser. No. 09/872,495 to Amin et al., filed June, 2001, each of which is incorporated by reference in their entirety.

Quantum Tunneling

In classical mechanics, for a particle occupying a ground state to move to another state (e.g., another ground state in a degenerate system), the particle must be given more energy than the potential barrier that separates the two states. However, if the particle is governed by quantum mechanics, it is possible for the particle to tunnel through the potential barrier separating the two states even when the particle does not have sufficient energy to pass over the potential barrier separating the two states. See, for example, Atkins, 1983, *Molecular Quantum Mechanics*, Oxford University Press, New York. Atkins explains that a particle (e.g., a Cooper pair) may be found inside a classically forbidden region (forbidden because the particle does not have sufficient energy to be in the region). Atkins calls this effect "penetration of the barrier" or "tunneling." This type of microscopic quantum tunneling is known in the art and, for example, characterizes the Josephson effect across Josephson junctions, where Cooper pairs pass through a region of non-superconducting material via the process of quantum tunneling. In superconductors and many other systems, the same quantum mechanical behavior extends to the mesoscopic scale where mesoscopic properties of the system (made up in part by contribution from Cooper pairs) behave according to quantum mechanical rules and hence demonstrate quantum tunneling.

Characterization of Qubits

Characterization of the classical and quantum behavior of a qubit is needed for qubit engineering. Qubits can be governed by the rules of classical mechanics or quantum mechanics. When qubits are governed by the rules of classical mechanics, they are said to be behaving "classically." Characterization of qubit when they are behaving classically helps to predict (calibrate) the quantum behavior of the qubit when it is governed by the rules of quantum mechanics. States of a qubit that are behaving classically are termed metastable states. Metastable states are local minima in the qubit's potential energy landscape. The state of the qubit behaving classically may be found in these local minima. If there is no thermal activation, the state of the qubit behaving will not change. Further, since the qubit is in a classical regime, it can not tunnel out of the local minima. Therefore the qubit remains in the local minima.

In order to effectively use qubits in a quantum computer, the tunneling rate of the qubit should be characterized. The appropriate characterization of this quantity can aid the engineering and development of various qubit designs. Certain Josephson junctions and junction networks that exhibit time reversal symmetry breaking are suited for quantum computing because of the existence of doubly degenerate ground states of persistent current. The states are degenerate but distinguishable through the existence of magnetic flux found in either "up" or "down" direction corresponding to the persistent current states. These currents can exist in system of junctions or at single Josephson junction. See Bocko et al., 1997, IEEE Transactions on Applied Superconductivity 7, 3638 and U.S. Pat. No. 6,459,097 B1, each of which is incorporated by reference in its entirety.

Recently, several superconducting qubits were tested. See Nakamura et al., 1999, Nature 398, pp. 786–788; Friedman et al., 2000, Nature 406, pp. 43–46; van der Wal et al., 2000, Science 290, pp. 773–777, each of which is incorporated by reference in their entireties. Measurement and characterization of these devices relied on the use of a dc SQUID. The use of such a SQUID for testing and characterization may have drawbacks, including the necessity for taking many measurements. The latter is a variant of microwave spectroscopy experiments that relied on a large number of measurements from which device characteristics can be statistically inferred. Data takes months to collect and therefore a more immediate and unobtrusive method for measurement and characterization of superconducting structures is needed.

SUMMARY

In accordance with embodiments of the present invention, the methods and apparatus for characterization and measurement of superconducting phase qubits are disclosed. Phase qubits comprised of singular Josephson junctions or groups of Josephson junctions connected in a superconducting loop are measured by embodiments of the present invention. Other qubits that have a loop to which an inductive coupling can be made can also be measured and characterized by embodiments of the present invention. In some embodiments, measurement of the nonlinear inductance of a superconducting structure as a function of the external magnetic flux can yield information on properties of the superconducting phase qubits. In particular the information about the energy states of the superconducting phase qubits can be determined.

In some embodiments, the qubit to be tested is presented in a loop coupled inductively to a tank circuit (or LC circuit) with a high quality factor Q. The effective inductance of a qubit is dependent on the bit-state of the qubit. Therefore, the effective impedance of the tank circuit with the loop is a function of the magnetic flux applied to the loop.

BRIEF DESCRIPTION OF THE DRAWINGS

FIG. 8 illustrates output plots from an embodiment of the invention.

Like reference numerals refer to corresponding parts throughout the several views of the drawings.

DETAILED DESCRIPTION

The present invention provides apparatus and methods for characterizing qubits. A well-characterized system is required to make a qubit. Certainly, the system need be quantum in nature but the designer and user of a qubit must have additional information about the qubit in order to effectively use the qubit in a quantum computer. The requirement of a well-characterized system is the first basic criteria of a qubit. See DiVincenzo in, Braunstein and Lo (eds.), 2001, Scalable Quantum Computers, Wiley-VCH Verlag GmbH, Berlin, Chapter 1. The physical parameters of the qubit should be known quantitatively to a high degree of accuracy. Additionally it is desirable that these parameters be measured and not merely calculated. These parameters can be classical (e.g., capacitance) or quantum (e.g. tunneling rate). The parameters are used to quantitatively define the Hamiltonian of the qubit, which determines the energy eigenstates of the qubit, and other important operational characteristics. Such operational characteristics include the period of elementary qubit operation. See United States Patent Application entitled "Degenerate level qubit operations," 60/443,764, Amin et al. A further criterion of quantum computing is that the elementary operation period be much shorter than the decoherence time of the qubit. Therefore, quantitative knowledge arising from a characterization of the qubit is useful to ensure that elementary operation periods are short than the decoherence time of the qubit.

Figure 1:
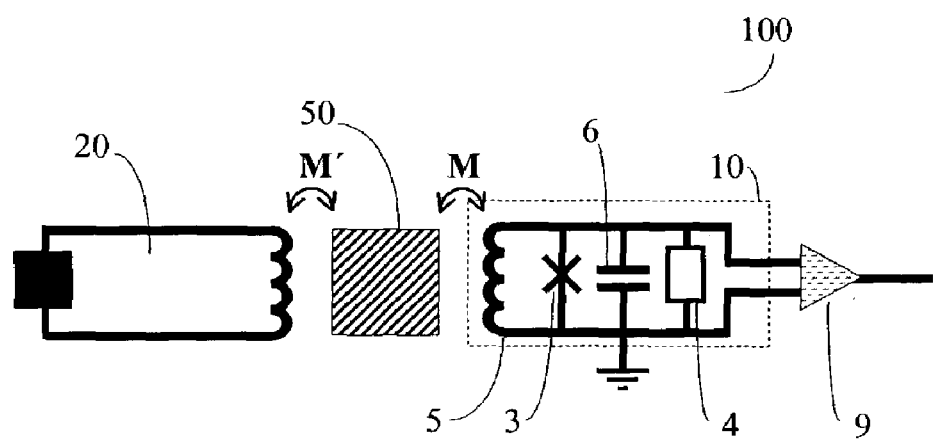
FIG. 1 illustrates a tank circuit, superconducting structure, and excitation device in accordance with one embodiment of the present invention.

FIG. 1 illustrates a generic embodiment of the present invention including a superconducting quantum device 50, a tank circuit 10, and an excitation device 20. System 100 must be arranged geometrically such that superconducting structure 50 has a mutual inductance M' with excitation device 20, and M with tank circuit 10. In an embodiment of the present invention, tank circuit 10 includes an inductance $L_T$ (5), capacitance $C_T$ (6), and a frequency dependent impedance $Z_T(\omega)$ (4), where $\omega$ is the applied frequency. Tank circuit 10 can further include one or more Josephson junctions 3. Tank circuit 10 has a resonant frequency $\omega_o$, that depends on the specific values of its characteristics, such as the $L_T$, $C_T$, and $Z(\omega)$ components. An embodiment of the present invention may make use of multiple inductors, capacitors, Josephson junctions, or impedance sources but, without loss of generality, the lumped circuit depiction illustrated in FIG. 1 can be used to describe tank circuit 10.

In operation, when an external signal is applied through tank circuit 10, a resonance can be induced such that the impedance of tank circuit 10 is maximized. In an embodiment of the present invention, a tank circuit is inductively coupled to a superconducting structure having quantum states such that the resonant frequency of the tank circuit is correlated with the respective state of the superconducting device.

In some embodiments of the present invention, superconducting structure 50 is a qubit having two distinct quantum states and a characteristic range of tunneling frequencies. In operation, characteristics of qubit 50, such as the tunneling frequency and decoherence times for example, can be probed by tank circuit 10 by applying signals through tank circuit 10 and measuring its response. The characteristics of tank circuit 10 can be observed by amplifier 9, for example (FIG. 1).

Figure 2:
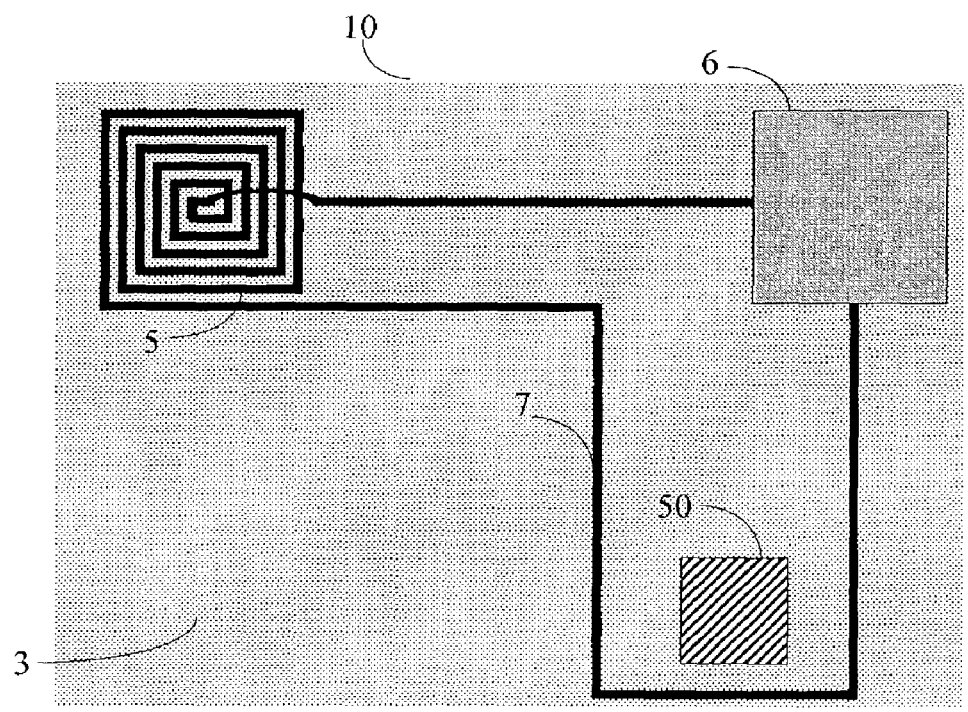
FIG. 2 illustrates an embodiment of a tank circuit and superconducting structure, in accordance with one embodiment of the present invention.

Embodiments of the present invention include the use of the tank circuit (or LRC-circuit) 10 shown in FIG. 2. Tank circuit 10 includes an inductor 5 and a capacitor 6, connected by leads 7. Tank circuit 10 is inductively coupled to a superconducting structure 50. Tank circuit 10 can be made from superconducting material or normal conducting material, and can be a free standing circuit or an integrated circuit on a substrate.

Tank circuit 10 may be constructed so as to minimize the resistance of the circuit and to select the tank circuit's quality factor, Q, and the frequency, $\omega_o$, of the circuit's resonance. Quality factor Q is defined as the ratio of the resonance frequency to the spectral width (full width half maximum) of a resonance response curve. The quality factor of tank circuit 10 is temperature dependent. An embodiment of the invention includes a tank circuit 10 that has a Q of 500 at 4.2 Kelvin (K) and a Q of 1500 at 1 K. In some embodiments of the present invention, the quality factor of tank circuit 10 ranges from 800 to 10,000 at temperatures below 5 K. In other embodiments the quality factor of tank circuit 10 is between 1,200 to 2,400 at temperatures below 5 K. In some embodiments of the present invention the quality factor of tank circuit 10 is 1,600 at temperatures below 1 K.

In some embodiments in accordance with FIG. 2, inductor 5 is a small wire coil that has multiple windings that are about 4 mm across. A winding is a 360° turn around a fixed point and a coil is a plurality of windings. The wire may comprise a ductile high quality conductor such as copper (Cu), silver (Ag), gold (Au) or a superconductor such as aluminum (Al) or niobium (Nb).

Referring to FIG. 2, when including tank circuit 10 in an integrated circuit that is designed to operate at sub-liquid helium temperatures, inductor 5, capacitor 6, and leads 7 can comprise low temperature superconductors such as Al, or Nb. In some embodiments of the present invention, inductor 5 includes about 1 to about 150 windings of 300 nm thick niobium film, each having a wire width of approximately 0.2 $\mu$m to about 0.5 $\mu$m. The windings can be spaced about 0.2 $\mu$m to about 5.0 $\mu$m apart. Additional embodiments of the invention include an inductor 5 with about 20 to about 30 windings. The shape of the windings in inductor 5 in FIG. 2 are depicted as four straight lines and vertices at right angles. This leads to a square coil with an inductance of about $n^2 L'$, where $L'$ is the inductance of the inner winding. Other embodiments of the present invention include windings in inductor 5 that are concentric circles with radial connections, a continuous spiral winding, or equivalent shapes (e.g., a quadratic layout). Inductor 5 can be augmented or replaced by a Josephson junction (see, for example, element 3 in FIG. 1) with or without a tunable current bias. This permits for the fabrication of an inductor 5 with a tunable inductance. This reduces the stray capacitance of the inductor windings with other circuit elements.

In some embodiments of the present invention capacitor 6 comprises two parallel plates. In such embodiments, the capacitor area can range from about 0.1 mm$^2$ to about 1 mm$^2$. In some embodiments, the dielectric constant, i.e. $\in/\in_o$ where $\in$ is the permittivity of the material and $\in_o$ is the permittivity of free space of the material in the capacitor can range depending on the dielectric material selected (e.g., 25 for $Nb_2O_5$, 11.5 for Si, and 10 for $Al_2O_3$). Some embodiments of the present invention include capacitors 6 that comprise multiple layers of different dielectrics. In some embodiments of the present invention, capacitor 6 has a capacitance of about $1.0 \times 10^{-13}$ Farads (F) to about $4.5 \times 10^{-8}$ F. Further, embodiments of the present invention include capacitors that have a capacitance that is between $4.0 \times 10^{-11}$ F and $1.0 \times 10^{-9}$ F.

In some embodiments of the present invention, the capacitor 6 shown in FIG. 1 is a surface mounted capacitor soldered onto substrate 3 (FIG. 2) after the rest of tank circuit 10 has been fabricated. In some embodiments of the present invention, surface mounted capacitor has a capacitance between 1 pico-Farad (pF) and 1 micro-Farad ($\mu$F).

In some embodiments, tank circuit 10 of FIG. 2 is fabricated on a substrate 3, and substrate 3 is made of a suitable substrate material such as silicon. Additionally, layers of niobium (Nb), aluminum oxide ($Al_2O_3$) and silicon oxide (SiO) may be deposited on substrate 3 by, for example, dc-magnetron, evaporation and etched using, for example, carbon tetra-fluoride reactive ion etching ($CF_4$-RIE) or any other suitable deposition and etching techniques. Structures can be patterned using well-known techniques such as optical or electron beam lithography. See Stolz et al., 1999, Superconductor Science and Technology 12, p. 806–808 (in particular, the first three paragraphs of section 2); Van Zant, 2000, Microchip Fabrication, Fourth Edition, McGraw-Hill, New York; Levinson, 2001, Principals of Lithography, SPIE Press, Bellingham, Washington; Rai-Choudhury (ed.), 1997, Handbook of Microlithography, Micromachining, and Microfabrication, SPIE Press, Bellingham, Wash.; and Madou, 2002, Fundamentals of Microfabrication, CRC Press, New York, each of which is hereby incorporated by reference in their entireties.

Referring to FIG. 2, in some embodiments, the windings of inductor 5, the plates of capacitor 6, and leads 7 can comprise layers of Nb, and are collectively called the wire layers. In some embodiments where capacitor 6 includes two parallel plates, the intermediate material between the plates comprises a 70 nanometer thick layer of $Nb_2O_5$ and/or $Al_2O_3$ and/or a layer of SiO that has a thickness between 100 nm and 400 nm. The wire layers may be separated from each other by 800 nm thick layers of SiO to eliminate stray or parasitic capacitance.

In FIG. 2 the inductive coupling M between tank circuit 10 and superconducting structure 50 is accomplished by enclosing superconducting structure 50 in lead 7, for example. In some embodiments inductive coupling M is achieved by placing superconducting structure 50 in the inner winding of inductor 5 (not shown). Any other type of suitable inductive coupling M can be used.

Superconducting structure 50 can be any phase qubit. For a review of phase qubits, see Makhlin et al., 2001, Reviews of Modern Physics 73, p. 357 (in particular pages 366–371; U.S. Pat. No. 6,459,097 B1; U.S. patent application Ser. No. 09/839,637 titled "Quantum Bit with a Multi-Terminal Junction and Loop with a Phase Shift"; and U.S. patent application Ser. No. 10/232,136, titled "Superconducting Low Inductance Qubit," each of which is incorporated herein by reference in its entirety.

Figure 3:
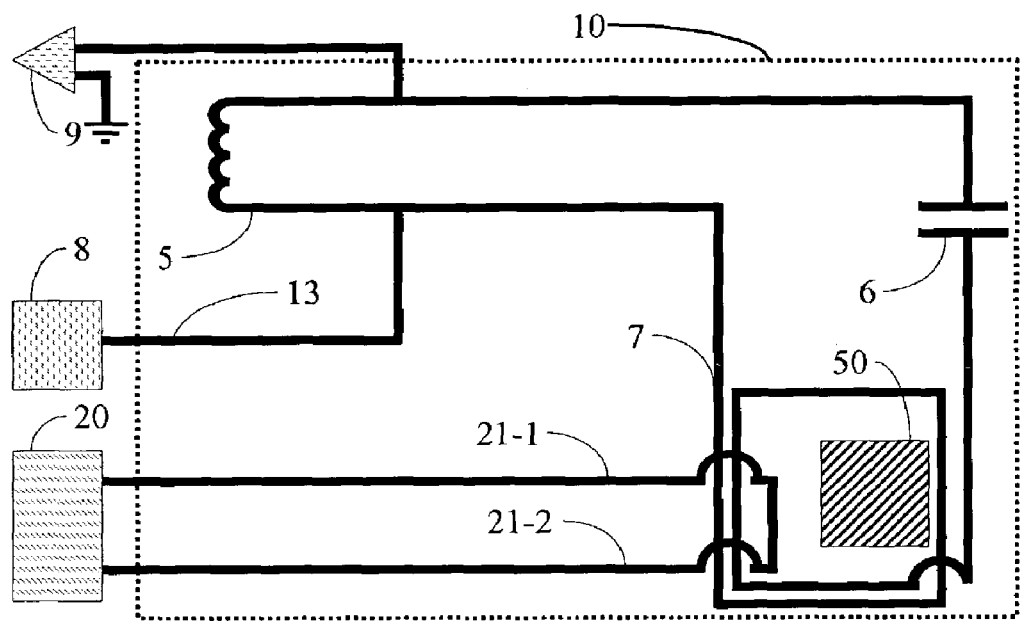
FIG. 3 illustrates an embodiment of a tank circuit with current source and amplifier, in accordance with one embodiment of the present invention.

Some embodiments of the present invention use tank circuit 10, as depicted in FIG. 3, coupled to current source 8, amplifier 9, and an optional excitation device 20. In some embodiments of the present invention, tank circuit 10 operates with an AC current and a DC current bias provided by current source 8. In some embodiments, current source 8 can be in a room temperature environment with the appropriate thermal isolations and impedance on lead 13 connecting to tank circuit 10. Alternatively an integrated or on-chip current source, can be used to implement one or both of the AC current and DC current biases. The excitation device 20, may be an electromagnetic radiation source, a current source, etc.

In addition to the inductive coupling illustrated between excitation device 20 and superconducting structure 50 in FIG. 1, capacitive or electrical coupling mechanisms can be used to couple excitation device 20 and superconducting structure 50. Tank circuit 10 is driven at measurement frequency, $\omega_m$, within about half the spectral width of the resonance frequency, $\omega_o$, by providing a current $I_m = I_{rf} + I_{dc}$, wherein $I_{rf}$ is an alternating current (AC) and $I_{dc}$ is a direct current (DC). The applied flux generated by the different current components thread superconducting structure 50. Thus, the applied flux $\Phi_e$ is therefore denoted as $\Phi_e = \Phi_{dc} + \Phi_{rf}$. Embodiments of the present invention include the use of $\Phi_{rf}$ in the small signal limit, where the amplitude of $\Phi_{rf}$ is in the small signal limit, when $\Phi_{rf}$ is much less than one flux quantum, $\Phi_o = h/2e$. Here, $\Phi_o$ is a unit of magnetic flux equal to $2.07 \times 10^{-8}$ T m$^2$. When $\Phi_{rf}$ is much less than $\Phi_o$, the applied flux is approximately equal to the DC flux.

In order to characterize superconducting structure 50, the structure must include a loop with an inductance L. Such loops are illustrated in FIG. 5. The loop is coupled inductively to tank circuit 10 with inductance $L_T$. The effective inductance of superconducting structure 50 is a function of its state. This is especially so when the superconducting structure 50 is a phase qubit. Phase qubits can have basis states that correspond to two different amounts of flux enclosed in the loop. Sometimes these qubits are called flux qubits. Due to the mutual inductance between superconducting structure 50 and tank circuit 10, the effective impedance of tank circuit 10 is a function of the state of superconducting structure 50, resulting from the fact that the magnetic flux in tank circuit 10 is a function of the flux in the qubit loop. In an embodiment of the present invention, amplifier 9 represents a mechanism for detecting change in the effective impedance of tank circuit 10. Changes in the effective impedance of tank circuit 10 manifest in observables such as a change in voltage, current, or a change in the phase of either the voltage or current.

In an embodiment of the present invention, back action between tank circuit 10 and superconducting structure 50 is diminished by reducing coupling between the devices. Back action is the influence of tank circuit 10 on superconducting structure 50. In an embodiment of the present invention in which superconducting structure 50 is a qubit, back action decreases the decoherence rate of the qubit. The coupling factor k, defined by $M = k(LL_T)^{1/2}$, where M is the mutual inductance between superconducting structure 50 and tank circuit 10, may be much less than one to minimize back action that may decohere superconducting structure 50. See, e.g., Il'ichev, 2001, Review of Scientific Instruments 72, pp. 1882–1887 which is hereby incorporated by reference in its entirety. In embodiments of the present invention, coupling factor k can range from 0.0001 to 0.1. Additionally, a screening current in superconducting structure 50 and the coupled superconducting structure 50 and tank circuit 10, arises from the inductance L and the mutual inductance M. The screening current is parameterized by the following formula:

$$\beta = \frac{2\pi L I_C}{\Phi_o},$$

where $\beta$ is the screening or hysteretic parameter of superconducting structure 50 and of the coupled superconducting structure 50 and tank circuit 10, $I_C$ is the critical current of superconducting structure 50, which represents the current magnitude at which superconducting structure 50 enters a non superconducting state. In embodiments of the present invention the screening parameter is small (e.g., $\beta$ is much smaller than 1).

Referring again to FIG. 3, excitation device 20, and wiring 21-1 and 21-2 can be used to bias superconducting structure 50. Excitation device 20 can be electrically, capicatively, or inductively coupled to superconducting structure 50. FIG. 3 illustrates excitation device inductively coupled to superconducting structure 50. In some embodiments, wires 21-1 and 21-2 have a current that creates a local magnetic field that influences superconducting structure 50. Alternatively, in some embodiments, wires 21-1 and 21-2 are used as an antenna. For example, pulses tuned to the energy difference between two energy states of the superconducting structure can be generated on wires 21-1 and 21-2 in order to induce transitions between discrete energy levels within superconducting structure 50. Pulses can be used to bias superconducting structure 50 or for general investigations of a two level system. Such general investigations include inducing Rabi oscillations between the basis states of a qubit.

In an embodiment having electrical coupling between excitation device 20 and superconducting structure 50, wires 21-1 and 21-2 directly connect to superconducting structure 50 in order to provide an electronic current bias. The purpose of biasing different types of qubits is known. See, for example U.S. Pat. No. 6,459,097 B1; Orlando, 1999, Physical Review B 60, pp.15398–15413, each of which is hereby incorporated by reference in its entirety. Further, this is useful for investigating the various properties of the system including the tunneling rate. See Han et al., 2001, Science 293, pp.1457–1459, which is hereby incorporated by reference in its entirety.

Figure 4:
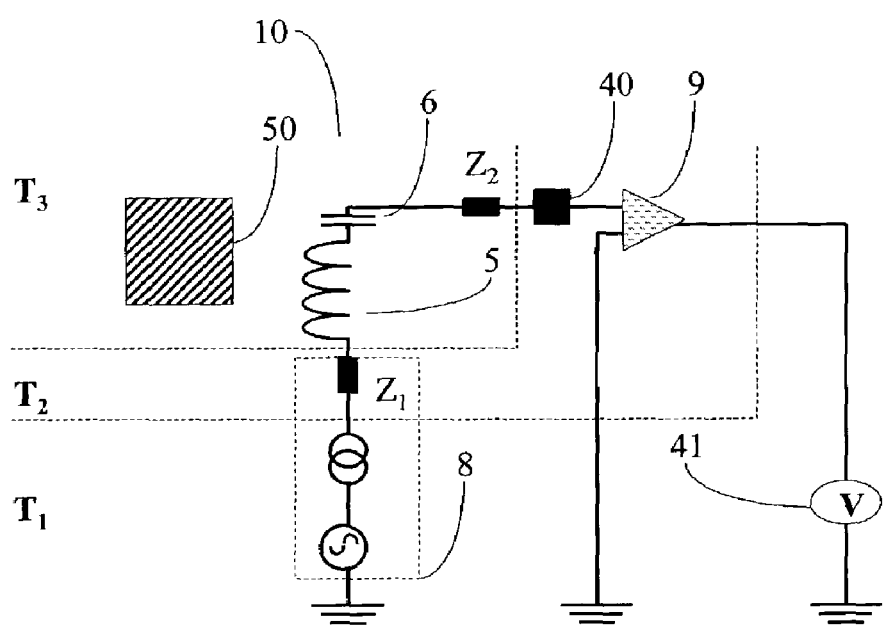
FIG. 4 illustrates an alternative embodiment of a tank circuit, and includes a temperature strata schematic in accordance with one embodiment of the present invention.

An alternative layout of tank circuit 10 in accordance with another aspect of the invention is illustrated in FIG. 4. In FIG. 4, inductor 5 and capacitor 6 are in series. As known to those of skill in the art, a low temperature apparatus for use in the present invention, such as the device shown in FIG. 4, has strata of temperature. These strata include a region at about room temperature $T_1$, where $T_1$, is approximately 300 K, a region at the liquid helium temperature $T_2$ (about 4.2 K), and, optionally, a region at a subliquid helium temperature $T_3$. The possible value of $T_3$ depends on the power of the refrigerator used, but about 5 mK to about 50 mK is an appropriate temperature for characterizing the qubits of interest. The temperature strata illustrated in FIG. 4 is merely exemplary, and a person having ordinary skill in the art will recognize that a change in the temperature strata does not change the substance of the present invention. In FIG. 4, amplifier 9 can be placed at temperatures other than as depicted. Embodiments of the present invention include the use of a low temperature amplifier at sub liquid helium temperatures. In some embodiments of the present invention $T_2$ is less than 5 K.

Shown, in addition to inductor 5 and capacitor 6 of tank circuit 10, are some details of current source 8 in standard electrical schematic notation. The impedance $Z_1$ attenuates the electrical and thermal signal from the $T_1$ environment to remove noise caused by signal reflection. An optional superconducting cable with characteristic impedance $Z_2$ connects the tank circuit 10 to the cold amplifier 9. An impedance matcher 40 ensures that no reflections or attenuation of the weak signal occurs between cable $Z_2$ and amplifier 9. The signal is read out from voltage meter 41.

Figure 5A:
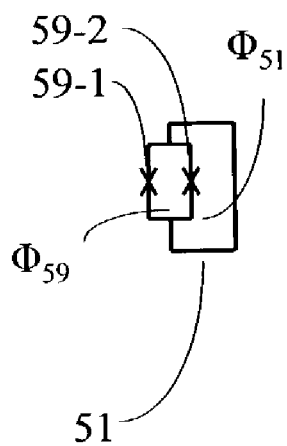
FIG. 5 shows some of the superconducting structures that can be characterized by embodiments of the present invention.
Figure 5B:
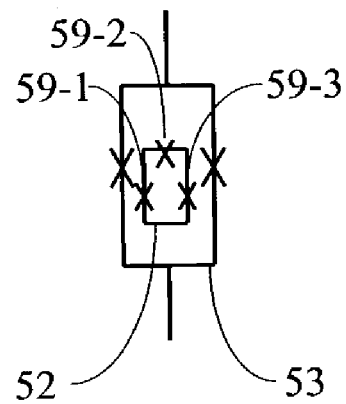

FIGS. 5A and 5B show examples of superconducting structures that can be characterized by embodiments of the present invention. In some embodiments, the superconducting structures are qubits (two state devices that show macroscopic quantum coherence). These devices obey the laws of quantum mechanics and have macroscopically observable effects and could be potentially integrated into a larger device called a quantum computer or other devices that process quantum information.

Superconducting structure 51 (FIG. 5A) is a device disclosed by Friedman et al., 2001, Nature 406, p. 43–46, which is hereby incorporated by reference in its entirety. Structure 51 is a phase qubit. The basis states of structure 51 correspond to definite values (often equal and opposite in sign) of phase across Josephson junctions 59-1 and 59-2. The phase qubit 51 is sometimes referred to in the art as a flux qubit, as the bit states of the qubit correspond to different directions of flux $\Phi_{51}$ enclosed in the loop. A person of skill in the art will appreciate that two definite phases across Josephson junctions 59-1 and 59-2 having opposite sign will lead to two directions of superconducting current in the loop. The closed loop of circulating current is associated with an enclosed flux $\Phi_{51}$ As taught in the disclosure of Friedman et al., the Josephson coupling across junctions 59-1 and 59-2 can be controlled by a separate flux $\Phi_{59}$. The flux can be generated by the optional excitation device 20 of FIG. 1 and FIG. 3.

Superconducting structure 52 (FIG. 5B) was originally disclosed by Mooij et al. See Mooij et al., 1999, Science 285, pp. 1036–1039 which is incorporated herein by reference. Structure 52 has three Josephson junctions 59 interrupting a loop. The qubit can be enclosed by a dc SQUID, which is used to bias the qubit.

Figure 6:
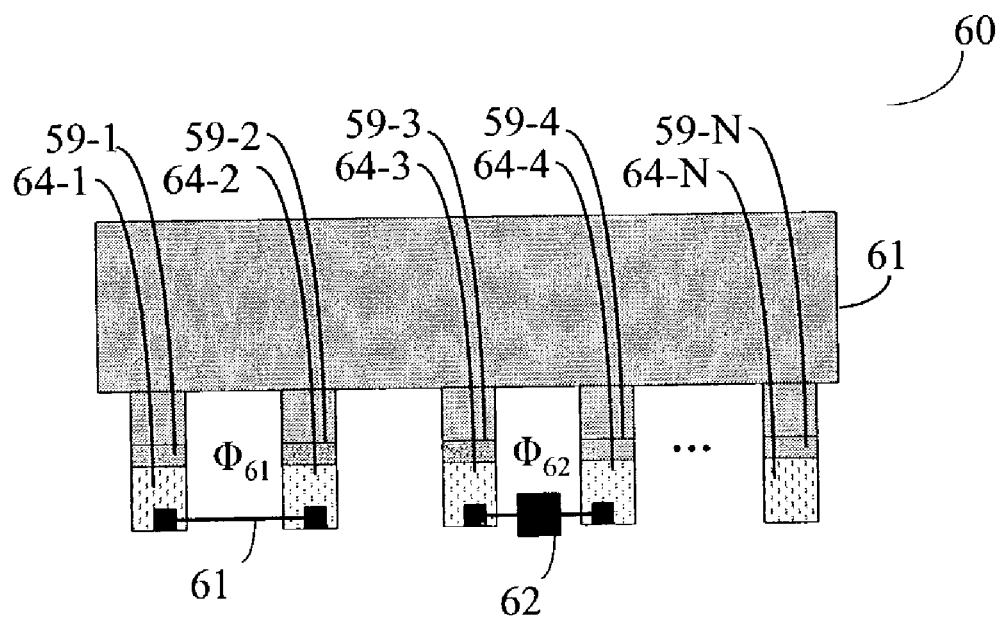
FIG. 6 illustrates a quantum register that can be characterized by embodiments of the present invention.

FIG. 6 illustrates another superconducting structure 60 that can be characterized by embodiments of the present invention. Structure 60 includes a bank 61 separated from an array of mesoscopic islands 64 by a group of Josephson junctions 59. Junctions 59 are described in more detail in U.S. Pat. No. 6,459,097 B1, which is hereby incorporated by reference in its entirety. Junctions 59 have a doubly degenerate ground states. Connections 61 and 62 exist between islands 64-1 and 64-2 as well as between islands 64-3 and 64-4. Connections 61 and 62 create loops. FIG. 6 illustrates connection 61 representing a permanent coupling without control, and controllable connection 62 representing a controllable coupling mechanism. Control refers to the ability for the coupling between the qubits to be switchable. A parity key or superconducting single electron transistor are examples of devices that can be used to implement a connection with control. A connecting lead is a connection without control. Fluxes $\Phi_{61}$ and $\Phi_{62}$ are each enclosed in a loop, which permits structure 60 to be characterized by embodiments of the present invention since an inductive coupling between structure 60 and tank circuit 10 is possible.

The structures that can be characterized by embodiments of the present invention are varied. Examples are given in FIGS. 5 and 6 by way of illustration only and not by limitation. The methods and equipment described herein can be used to characterize an arbitrary phase qubit having a wide range of characteristics. Further, embodiments of the present invention can be used to characterize qubits that operate in the limit of well defined charge, provided the qubits can be inductively coupled to tank circuit 10. For example, one charge qubit that has the ability to inductively couple to tank circuit 10 is disclosed by Makhlin et al., 2001, Reviews of Modern Physics 73, p. 357, which is hereby incorporated by reference in its entirety.

As recited above, the effective inductance of the superconducting structure 50 is a function of its state. Because tank circuit 10 is inductively coupled to the superconducting structure, observations of circuit 10 provide data on structure 50. Such data includes the phase response of tank circuit 10 relative to applied signal, e.g. $I_{rf}$ and $\Phi_{rf}$, the magnitude of the tank's voltage oscillations, and the phase of the tank's voltage oscillations.

Figure 7A:
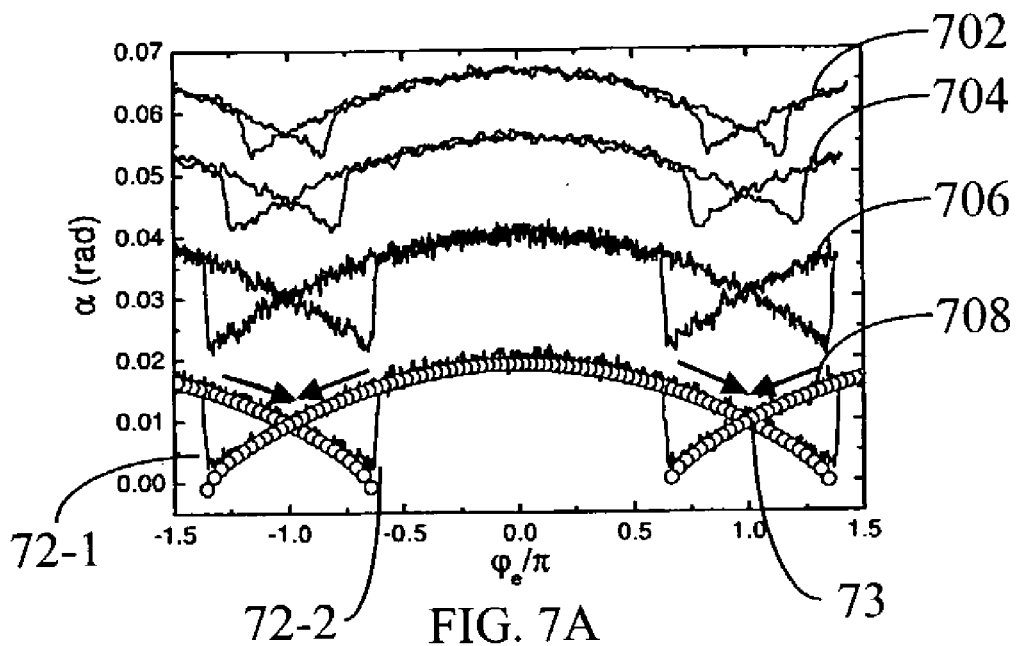
FIG. 7 illustrates sample data and theoretical plots from embodiments of the invention used in conjunction with an example of a superconducting structure.

FIG. 7A shows a sample of data that can be used to characterize a superconducting structure such as a qubit. The existence and disappearance of metastable states in a qubit can be observed thorough the observation of classical hysteresis and discontinuities in the tank circuit response. Classical hysteresis is a lagging of state. A common example of hysteresis is an electromagnet made out of a coil with a ferromagnetic core. The magnetic field in the core (a dependent parameter) increases with the current in the coil (an independent parameter). The data presented in FIG. 7A illustrates the existence of two metastable states in the energy applied flux profile of superconducting structure. The data presented in FIG. 7A quantifies the width and height of the energy barrier that separates the metastable states. An energy profile with two metastable states is also referred to as having a double well potential. The data illustrated in FIG. 7A was obtained by a method of data collection where flux is applied and the magnitude of the applied flux is swept from zero to several flux quantums, $n\Phi_o$ (n>1). In this method, data capture begins with only rf flux in the loop. The flux is varied from about zero dc flux (i.e. $\Phi_e \approx \Phi_{rf}$) to a level of applied flux greater that is several flux quantums. With each successive flux quantum of flux applied, the qubit passes through the degeneracy point, as the energy potential is periodic. The applied flux $\Phi_e$ is then increased to the qubit, while monitoring the phase difference $\alpha$, between the phase of the applied current and the phase of the response voltage in tank circuit 10. The applied flux has an rf component in the small signal limit as taught above (magnitude much less than one fluxon).

As the magnitude of the applied flux is swept, the energy potential of the qubit changes. FIG. 8A illustrates a double well energy potential 80. The energy potential 80 has two minima 82-1 and 82-2 separated by a barrier 81. Energy potential 80 corresponds to a qubit that is degenerate and unbiased. Minima 82-1 and 82-2 have equal energy. Embodiments of the present invention include the example where energy potential 80 corresponds to a nondegenerate qubit that is biased. As the qubit is biased, for example by changing the applied flux the $\Phi_e$, the energy of one minima (82-1 or 82-2) increases. This phenomenon is illustrated in FIG. 8B. In FIG. 8B, the barrier 81 between 82-1 and 82-2 has been reduced. When the qubit is in minima 82-1 and is in a classical regime in the absence of thermal energy, the qubit is said to be in a metastable state. The state of the qubit cannot be altered. As the biasing is increased the barrier 81 separating 82-1 and 82-2 disappears.

The effect of biasing a qubit is depicted in FIG. 8C, for a qubit similar to qubit 53 of FIG. 5B. The basis states of the qubit are degenerate when the applied flux is one half of a flux quantum, $\Phi_o/2$, such that a double well profile similar to that of FIG. 8A is achieved. Changes in the flux affect a tilt in the double well potential, resulting in a double well profile as illustrated in FIG. 8B. The classical hysteretic behavior around the degeneracy point is apparent in FIG. 8C, where a discontinuous jump occurs when the barrier 81 between minima 82 vanishes. As a result, there is only one minimum. Embodiments of the present invention can produce plots like FIG. 8C from data such as that shown in FIG. 7A.

FIG. 7A illustrates a plot of the phase difference, $\alpha$, between the driving current Irf and the output voltage as measured at 41 (in FIG. 4) as a function of external magnetic flux. The data is for a superconducting structure similar to that illustrated in FIG. 5B. For the curves illustrated from top to bottom, the data correspond to measurements taken at the following temperatures 800 (curve 702), 500 (curve 704), 100 (curve 706), and 20 mK (curve 708). Arrows in FIG. 7A illustrate the respective increase and decrease of applied flux. The plot has normalized units where, $\phi_e=(2\pi/\Phi_o)\Phi_e$ on the horizontal axis. The experimental data (solid line) measured at 20 mK are fitted by theoretical model (circles). The data are vertically shifted about 0.02 radians for clarity. The noise in the plots is useful in determining the noise inherent in the system.

Embodiments of the present invention can make use of systems that disclose hysteretic behavior. In FIG. 7A it is evident that, for particular values of applied flux, there are different phase difference values $\alpha$ in the tank circuit. Specifically between points 72-1 and 72-2, there are two values of phase difference $\alpha$ for each value of applied flux. Outside the domain of these points, the plot is single valued. The existence a local region where there are two values of phase difference corresponding to a single value of applied flux suggests hysteretic behavior. The fact that the two phase difference values correspond to different values of the derivative of the applied flux, i.e. increasing and decreasing, further suggest hysteretic behavior. The existence of jumps at points 72-1 and 72-2 and elsewhere suggest the hysteretic behavior manifests itsself because of the existence of two metastable states. Finally, there is a degeneracy point 73 (and elsewhere) where the phase difference is equal. This suggests that the metastable states have a degeneracy point where both metastable states are of equal energy.

In embodiments of the present invention, qubits are employed where the two metastable states of the qubit physically correspond to the superconducting current flowing clockwise and counterclockwise in a loop of the superconducting structure 50. Information about barrier height 81 and barrier 81 width is read from the plot by observing the distance from the degeneracy point ($\phi_e/\pi=\pm1.0$) to the point that the hysteresis disappears, i.e. the classical jump to the other metastable state. The jump occurs when the applied flux biases the qubit to such a degree that only one metastable state exists. From the size of the barrier and the capacitance of the superconducting structure the tunneling rate $\Delta$ can be determined.

Complete information about superconducting structure 50 can be inferred from plots like that shown in FIG. 7A. This includes the current and energy versus phase profiles that are determined by numerical integration of the following formula:

$$\tan(\alpha) = \frac{\beta i'(\varphi)}{1+\beta i'(\varphi)}$$

where i' ($\phi$) is the phase profile. This will yield a complete energy phase profile that will clearly show the potential of a barrier that separates the metastable states. Further, the energy level splitting can easily be read from such a profile when plotted. See, for example, Il'ichev et al., 1998, Applied Physics Letters 72, p 731, which is hereby incorporated by reference in its entirety.

Figure 7B:
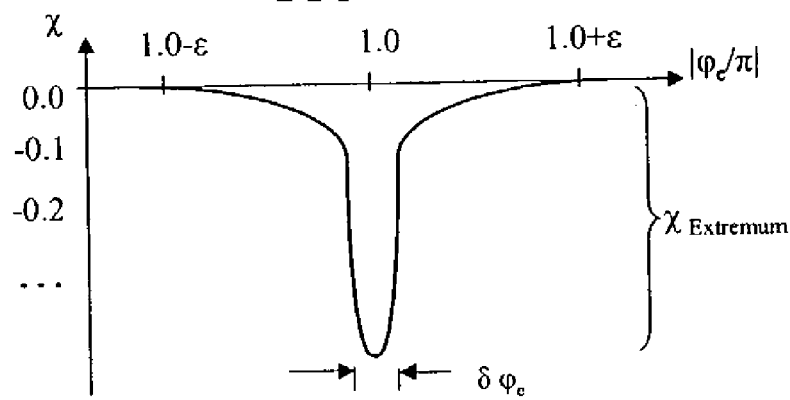

FIG. 7B shows an alternative approach to observing the effect of the superconducting structure on tank circuit 10. The voltage of tank circuit 10 has a response that can be modeled as $$V(t)=v(t)\cos[\omega t+\chi(t)]$$

where t is time and $\omega$ is the angular frequency of the tank response. Both phase $\chi$ and amplitude v are time dependent quantities. The phase $\chi$ of tank circuit 10 response can be plotted as shown in FIG. 7B. At degeneracy points, e.g. $|\phi_e/\pi|=1.0$, a dip in the phase is observed. It begins at 1.0-$\epsilon$ where the phase departs from its steady state value. The phase has an extreme at or near 1.0 and then returns to its steady state value near 1.0+$\epsilon$.

Data similar to that illustrated in FIG. 7B can be obtained by operating an embodiment of the present invention in a similar manner to the method described in conjunction with FIG. 7A. Embodiments of the present invention include a method of data collection where the applied flux is applied and varied from zero to several flux quantums, $n\Phi_o$, where n>1. With only rf flux in the loop data capture begins. The flux is varied from about zero dc flux i.e. $\Phi_e \approx \Phi_{rf}$ to a level of applied flux greater that is several flux quantums. With each successive flux quantum of flux applied, the qubit passes through the degeneracy point, as the energy potential is period. While applied flux $\Phi_e$ is increased, the phase (as depicted) or the amplitude (similar graph with different scale and units) of the tank circuit 10 response is monitored. At the degeneracy point, about $\phi_e/\pi$, the variable under observation, phase or amplitude, changes drastically like a resonance and then as the applied flux is further increased the variable is restored to about its original value. This extreme is either a dip (as depicted) or a peak occurs where the curvature of the superconducting structure's energy profile is sharply negative. See, for example, Greenberg, et al., 2002, "Low-frequency characterization of quantum tunneling in flux qubits" Los Alamos National Laboratory Preprint Server cond-mat/0208076, pp. 1–6, which is incorporated by reference in its entirety.

The change in magnitude of the response of the tank circuit $\chi_{Extremum}$ can range from 0.01 radians to about 6 radians for the phase signal. The change in magnitude of the response of the tank circuit $\chi_{Extremum}$ can range from 0.02 microvolt ($\mu$V) to 1 $\mu$V for the amplitude signal. The response of tank circuit 10 is effected by the level of anticrossing of the lowest two eigenstates of the energy for the superconducting structure 50. The width of the extremum, $\delta\phi_e$, is proportional to the tunneling frequency $\Delta$ between the metastable states i.e. well 82-1 and well 82-2 of the energy potential 80 in FIG. 8A. The width is a full width half maximum value. The tunneling frequency is proportional to the gap between the quantum energy levels 88 and 89 in FIG. 8D, i.e. the gap is proportional to $\hbar\Delta$.

Figure 9:
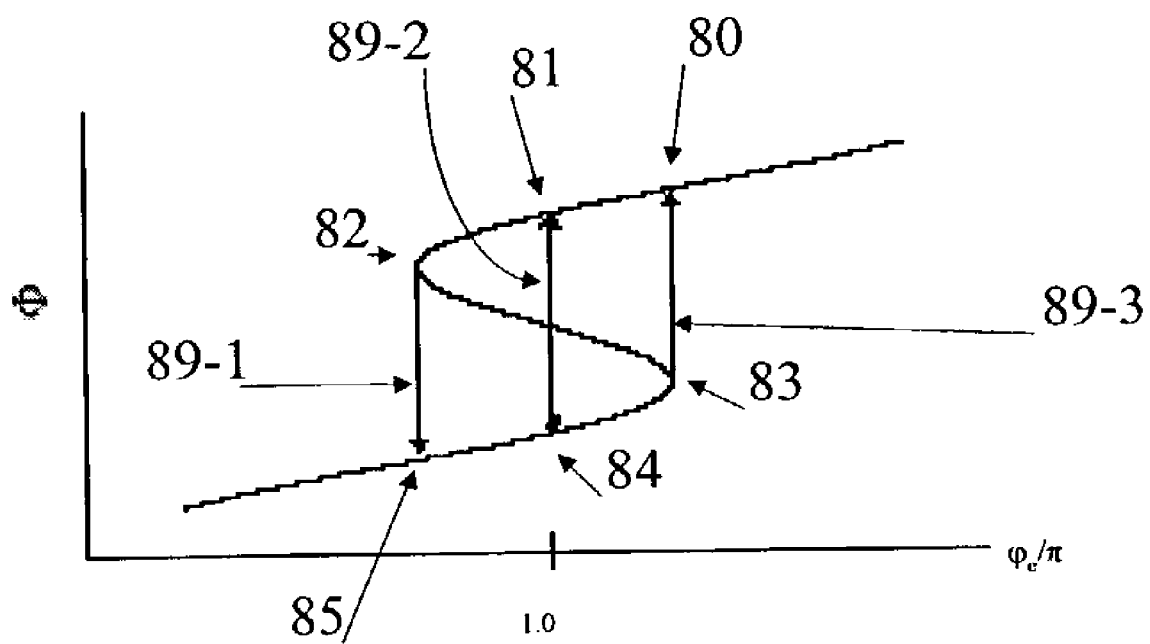
FIG. 9 illustrates Landau-Zenner tunneling.

Embodiments of the present invention can include the observation of hysteresis behavior and tunneling. Landau-Zener tunneling is a combination of tunneling events and classical hysteresis loops. See, Zener, 1932, Proceeding Royal Society London A 137, 696, which is hereby incorporated by reference in its entirety. Therefore, the effects of Landau-Zener tunneling combine the effects in FIG. 7A and FIG. 7B. Hysteresis is often depicted in the form of a classical hysteresis loop: a closed path in the parameter space of the state of the system. As the state of the system is altered by first increasing the independent parameter and then decreasing the independent parameter the system traces out a closed path, the hysteresis loop. The area in the closed path is proportional to the energy lost by the system. In FIG. 9 Landau-Zener tunneling, a quantum transition in a two-level system that occurs during the level crossing, is schematically depicted. In an embodiment of the present invention real time observation of quantum interference of Landau-Zener tunneling events can be made. In FIG. 9 a plot of the total flux in a superconducting structure such as a flux qubit is plotted against the applied flux. The metastable states of the qubit lead to a plot which is not one to one near the degeneracy point $\phi_e/\pi=1.0$. FIG. 9 is an alternative depiction of the hysteresis shown in FIG. 7A and FIG. 8C. The classical jumps of the hysteretic behaviour are present here. A jump event can occur from point 83 to point 80. A jump event can occur from point 82 to point 85. A classical hysteresis loop is the path 85 to 83, an increase in applied flux, 83 jumping to 80, at the disappearance of a metastable state, 80 to 82, a decrease in applied flux, and 82 jumping to 85, at the disappearance of another metastable state. However, if the qubit is in the quantum regime there is the possibility the state will tunnel i.e. transition out of a metastable state such as 82-1 of FIG. 8A by tunneling through (under) the barrier that defines the state. A tunneling event can occur from point 81 to point 84 and the reverse. These points lie at the degeneracy point of the qubit where the applied flux equals one half of a flux quantum.

The plot of Landau-Zenner tunneling in FIG. 9 can be generated by sweeping applied flux $\Phi_e$ in the apparatus of the present invention. As the applied flux increases the plot passes points 85 through 80. As the applied flux decreases the plot passes points 80 through 85. Examining the former case at point 83, there is an opportunity for the state to jump forward to 80. At point 82 the state can jump backwards. As the applied flux is swept over a range from about $\Phi_{dc}\approx 0$ to $\Phi_{dc}\approx n\Phi_o$, where n>1, qubit 50 will tunnel. Tunneling can occur at points 81 and 84.

There are multiple paths for the state of qubit 50 to take in FIG. 9. These paths include combinations of classical jumps and quantum tunneling. The existence of multiple paths leads to quantum interference phenomena. The interference of the paths transitions manifests itself in the fine structure of the tank circuit 10 voltage response to the applied field. The output data is plotted in a fashion similar to FIG. 7B. The extremum has several small extrema that corresponds to tunneling events, and combinations of tunneling events and jumps.

Although the invention has been described with reference to particular embodiments, the description is only examples of the invention's applications and should not be taken as limiting. Various adaptations and combinations of features of the embodiments disclosed are within the scope of the invention as defined by the following claims.

All references cited herein are incorporated herein by reference in their entirety and for all purposes to the same extent as if each individual publication or patent or patent publication was specifically and individually indicated to be incorporated by reference in its entirety for all purposes.

What is claimed is:

1. A method comprising:
   reading out a state of a phase qubit that is inductively coupled to a tank circuit;
   applying a first flux to said phase qubit, wherein said first flux approaches a net zero flux;
   applying a second flux to said phase qubit, wherein said second flux has an increased level of flux relative to said first flux; and
   observing a response of said tank circuit in a readout device to said second flux, wherein said observing comprises monitoring an existence of a metastable state of said phase qubit or a disappearance of a metastable state of said phase qubit.

2. A method comprising:
   reading out a state of a phase qubit that is inductively coupled to a tank circuit;
   applying a first flux to said phase qubit, wherein said first flux approaches a net zero flux;
   applying a second flux to said phase qubit, wherein said second flux has an increased level of flux relative to said first flux; and
   observing a response of said tank circuit in a readout device to said second flux, wherein said observing comprises monitoring a hysteretic behavior of the tank circuit.

3. A method comprising:
   reading out a state of a phase qubit that is inductively coupled to a tank circuit;
   applying a first flux to said phase qubit, wherein said first flux approaches a net zero flux;
   applying a second flux to said phase qubit, wherein said second flux has an increased level of flux relative to said first flux; and
   observing a response of said tank circuit in a readout device to said second flux, wherein said observing comprises determining a magnitude of a tunneling rate of the phase qubit.

* * * * *